United States Patent [19]

Shaw

[11] 4,128,774
[45] Dec. 5, 1978

[54] N CYCLE GATED PERIODIC WAVEFORM GENERATOR

[75] Inventor: Clifford O. Shaw, Ridgecrest, Calif.

[73] Assignee: The United States of America as represented by the Secretary of the Navy, Washington, D.C.

[21] Appl. No.: 807,947

[22] Filed: Jun. 20, 1977

[51] Int. Cl.² .................................................. H03K 3/78
[52] U.S. Cl. ........................................ 307/260; 307/354; 328/61; 328/73; 328/129; 328/154
[58] Field of Search .................... 307/354, 273, 230; 328/129, 152, 154, 73, 61

[56] References Cited

U.S. PATENT DOCUMENTS

| | | | |
|---|---|---|---|
| 3,226,568 | 12/1965 | Samwel | 328/129 X |
| 3,579,126 | 5/1971 | Paul | 328/129 |
| 3,581,213 | 5/1971 | Crump | 328/25 |
| 3,610,953 | 10/1971 | Gordon | 307/230 |
| 3,633,094 | 1/1972 | Clements | 328/18 |
| 3,806,739 | 4/1974 | Irie et al. | 307/252 T |
| 3,925,688 | 12/1975 | Kalfus | 307/252 B |
| 4,052,676 | 10/1977 | Crittenden | 328/129 X |
| 4,072,870 | 2/1978 | Davis | 307/354 |

*Primary Examiner*—John S. Heyman
*Attorney, Agent, or Firm*—R. S. Sciascia; Roy Miller; W. Thom Skeer

[57] ABSTRACT

A gated waveform generator programmable to produce an output having a predetermined number of cycles. A triggering pulse and the output from a zero-crossing detector are connected to different inputs of a bistable multivibrator. The triggering pulse causes the cyclic input signal to be applied to the zero-crossing detector so that the output of the bistable multivibrator is pulse coincident with a mode of the input signal. The outputs of the zero-crossing detector and the bistable multivibrator are connected to a monostable multivibrator having a period controlled by a timing network which determines the number of cycles in the output of the signal sources. Upon the occurrence of its first mode after the triggering pulse, the input signal is coupled for the determined time to an operational amplifier from which the output of the signal source is taken.

13 Claims, 1 Drawing Figure

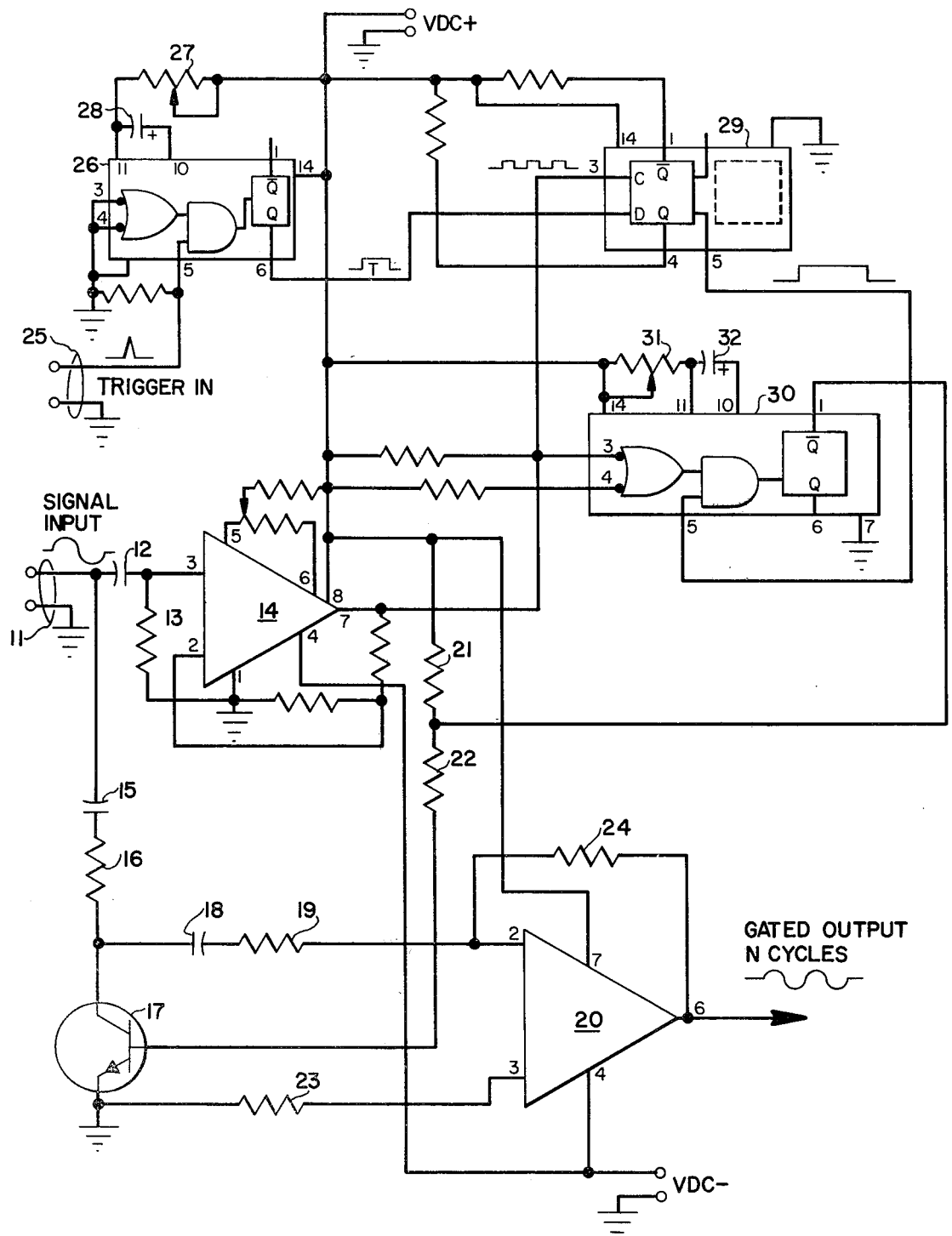

N CYCLE GATED PERIODIC WAVEFORM GENERATOR

BACKGROUND OF THE INVENTION

1. Field of the Invention.

This invention pertains to the field of electronics. More particularly, the invention pertains to the field of alternating current circuitry. By way of further characterization, the invention concerns a signal source useful in testing and operation of other electronic circuitry. In still greater particularity, the invention is directed to a signal burst generator. By way of illustration, the invention is described as it pertains to a burst generator delivering a selected number of cycles of a particular cyclic waveform upon the application of a trigger pulse.

2. Description of the prior art.

The testing of electronic circuitry frequently requires the measurement of the response to a limited duration, high-frequency, alternating current energy. The requirement for extremely short bursts poses particularly stringent demands on the test equipment supplying the test signal. In bursts of energy having such limited duration as to constitute fewer than ten cycles, for example, a problem arises as to maintaining uniform energy in each burst required to obtain uniform response by the test circuit to the individual bursts. A need, unmet by the prior art, has existed for a signal source which will supply upon demand a burst of a finite number of cycles which have a high degree of reproducibility and of the same power content.

Prior art systems exist for the control of electrical signals in synchronism with other cyclic waveforms. Additionally, known systems periodically interrupt continuous signals into bursts of a finite number of pulses which recur regularly thereby dividing the signal into a plurality of cyclic bursts. Similarly, circuits are available to apply power in synchronism with the power phase to a load. While these circuits are satisfactory for their intended purposes, they have not overcome the problems in the signal generation arts discussed above.

SUMMARY OF THE INVENTION

The object of this invention is to provide a triggered burst of electrical energy having uniform burst-to-burst power and uniformity of burst configuration. This is accomplished by generating a trigger logic pulse from the trigger signal which, together with an output signal from a level detector circuit, is used to trigger a bistable multivibrator to control a shunt switch for selected passage of a predetermined number of cycles of a cyclic signal.

BRIEF DESCRIPTION OF THE DRAWINGS

The single FIGURE is a schematic representation of the invention.

DESCRIPTION OF THE PREFERRED EMBODIMENT

Referring to the FIGURE, the signal having a cyclic repetition is applied at terminal 11 which constitutes a source of cyclic electrical energy for the circuit. This signal is coupled, via a coupling network including capacitor 12 and resistor 13, to a zero-crossing detector 14. Zero-crossing detector 14 is a conventional circuit and may, if desired, utilize a prepackaged integrated circuit of a conventional type. In developmental models of the invention, a type designated as LM111 has proven satisfactory.

A source of cyclic electrical energy appearing at terminal 11 is also connected to a shunt transistor 17, via capacitor 15 and resistor 16. Transistor 17 is normally conducting and, in such a conducting mode, shunts the cyclic input signal to ground. During periods of nonconduction, the cyclic electrical signal is coupled to an operational amplifier 20 by means of an RC network including capacitor 18 and resistor 19. The control of transistor 17 is dependent upon a biasing network including resistors 21 and 22. Upon application of a gate signal at the junction of resistors 21 and 22, transistor 17 is cut off to cause the signal to be connected to operational amplifier 20. The gain of operational amplifier 20 is controlled in conventional fashion by means of resistors 23 and 24. Thus, the alternate shunting and coupling functions of transistor 17 serve as a switching means to select one of two current paths.

The cyclic electrical energy applied at 11 may be any energy which is desired to be gated as a burst signal to a suitable load device, not shown. For purposes of explanation a sinewave is illustrated, but, as will be recognized, other recurring waveform shapes may be utilized by the circuit of the invention.

Control of the circuit commences with the application of a trigger signal to terminals 25. Thus, terminals 25 may be considered a source of trigger signals for the circuit of the invention. The source of trigger signals is connected to a monostable multivibrator 26 in order to produce a single pulse output to serve as an initiating pulse. Monostable multivibrator 26 is a conventional integrated circuit including logic inputs. A variety of circuits are known in the art. However, for purposes of completeness, it should be noted that the unit sold under the trade designator 54121 has proven satisfactory in practice of the invention. The width of the pulse output is controlled, in a conventional fashion, by means of a variable resistance 27 and a timing capacitor 28. The values of resistor 27 and capacitor 28 are chosen such that the output is of approximately the duration of one cycle of the cyclic electrical energy. The output of monostable multivibrator 26 is connected to the D input of a bistable multivibrator 29. The C input of bistable multivibrator 29 is connected to zero-crossing detector 14. Thus, the output of bistable multivibrator 29 is a pulse coincident with the zero-crossing of the original signal input and, therefore, has a pulse width of exactly one cycle. This triggering arrangement is particularly useful where the trigger input has a duration of less than one-half cycle and prevents "half-cycling" of the circuit.

A variety of integrated circuit bistable multivibrators suitable for this task are known in the art and choice among them is dependent upon the particular parameters of operation required. However, it should be noted that an integrated circuit marketed under the trade designation 5474 has proven satisfactory in developmental models of the circuit. As illustrated, the 5474 bistable multivibrator contains two independent multivibrator circuits. One is used in this application leaving the remaining circuit available for incorporation into other assosicated circuitry.

The output of bistable multivibrator 29 is connected to a logic gated input of monostable multivibrator 30. Monostable multivibrator 30 may be of the same type as monostable multivibrator 26 and has a period controlled by a timing network comprising resistor 31 and capacitor 32. The values of resistance 31 and capacitor 32 are chosen to provide a time constant having a duration of the approximate number of cycles desired in the burst of cyclic energy. The output from zero-crossing detector 14 is coupled to the logic input of monostable multivibrator 30 along with the output of bistable multivibrator 29 such that an output having synchronism with the applied cyclic signal and having an integral number of cycles is obtained.

The output from monostable multivibrator 30 is taken from the $\bar{Q}$ terminal to produce the desired negative synchronizing pulse which is connected to the junction of biasing resistors 21 and 22 so as to control the conduction of transistor 17, as previously explained.

Thus, it may be seen that the described circuit functions to deliver a burst of a predetermined number of cycles of input energy in response to a narrow trigger signal. Further, since each of these pulses starts with the same point on the cyclic energy input, there is no dc offset occasioned by irregular or asymmetric starting and stopping. As previously noted, certain substitutions in the circuitry and operation may be made in keeping with good design practice by persons skilled in the electronic processing arts. For example, zero-crossing detector 14 may be set to respond to a different voltage than zero volts by altering the value of the variable resistances used in the feedback circuit. Similarly, other circuit changes may be made using good engineering standards with recognition of the trade-offs occasioned by such changes.

The foregoing description taken together with the appended claims constitute a disclosure such as to enable persons skilled in the electronics and signal processing arts and having the benefit of the teachings contained therein to make and use the invention. Further, the structure herein described is seen to generally constitute a meritorious advance in the art unobvious to such a person not having the benefit of these teachings.

I claim:

1. A periodic waveform generator for accurately producing a predetermined number of complete cycles of a cyclic waveform comprising:
   a source of cyclic electrical energy having a desired waveform;
   detector means connected to said source of cyclic electrical energy for producing an output corresponding to the cyclic electrical energy attaining a predetermined value on each cycle thereof;
   switch means connected to said source of cyclic electrical energy and effectively connected to said detector means for selecting one of two current paths;
   a first path where said cyclic electrical energy is shunted to ground;
   a second path for passing a predetermined number of cycles of said cyclic electrical energy having said desired waveform and timing the passed cyclic electrical energy from the time that the predetermined value was attained;
   a source of trigger signals; and
   a control circuit connected to said source of trigger signals and effectively connected to said switch means for initiating the selection of one of said two paths.

2. A periodic waveform generator according to claim 1 wherein said detector is a zero crossing detector.

3. A periodic waveform generator according to claim 1 wherein said gate means includes an operation amplifier and a solid state switch.

4. A periodic waveform generator according to claim 3 wherein said solid state switch is a transistor placed across said operational amplifier input to selectively shunt signals from said source of cyclic energy to ground.

5. A periodic waveform generator according to claim 4 in which the aforesaid detector means is a zero-crossing detector.

6. A triggered waveform generator for producing a predetermined number of complete cycles of a cyclic waveform comprising:
   a source of cyclic signals;
   an amplifier having an input connected to said source of cyclic signals;
   a control switch connected across the input of said amplifier to shunt the cyclic signals to ground except when activated;
   a detector connected to said source of cyclic signals for detecting the occurrence of the cyclic signal attaining a predetermined operational level;
   a source of trigger signals;
   a first monostable multivibrator connected to said source of trigger signals for producing an output in response thereto;
   a first control circuit connected to said monostable multivibrator for regulating the duration of the output thereof to a value which is approximately equal to the period of one cycle of said cyclic signal;
   a bistable multivibrator connected to said first monostable multivibrator and to said detector and configured to produce an output corresponding to the cyclic signal having attained said predetermined operational level and of a duration determined by said first monostable multivibrator;
   a second monostable multivibrator having an input effectively connected to said bistable multivibrator to receive output signals therefrom and having an output connected to said control switch to provide activation thereof; and
   a second control circuit connected to said second monostable multivibrator and to said detector for determining the length of the output pulse therefrom to an integral number of pulses of said cyclic signal and in synchronism with said cyclic signal attaining said predetermined value, wherein said control switch is activated to permit said amplifier to pass the cyclic signals.

7. A periodic waveform generator for accurately producing a predetermined number of complete cycles of a cyclic waveform comprising:
   a source of cyclic electrical energy;
   detector means connected to said souce of cyclic electrical energy for producing an output corresponding to the cyclic electrical energy attaining a predetermined value on each cycle thereof;
   a monostable multivibrator connected to said detector means to receive the output therefrom;
   gate means connected to aid source of cyclic electrical energy and connected to said monostable multivibrator for passage of a predetermined number of cycles of said cyclic electrical energy and timing the passed cyclic electrical energy from the time that the predetermined value was attained;
   a source of trigger signals; and a control circuit connected to said souce of trigger signals and effectively connected to said gate means for initiating the passage of said cyclic energy.

8. A periodic waveform generator according to claim 7 wherein said gate means includes an operational amplifier and a solid state switch.

9. A periodic waveform generator according to claim 8 wherein said solid state switch is a transistor placed across said operational amplifier input to selectively shunt signals from said source of cyclic energy to ground.

10. A periodic waveform generator according to claim 9 in which the aforesaid detector means is a zero-crossing detector.

11. A periodic waveform generator according to claim 7 wherein said detector is a zero-crossing detector.

12. A periodic waveform generator according to claim 7 wherein the aforesaid effective connection between said control circuit and said gate means includes a bistable multivibrator.

13. A periodic waveform generator according to claim 12 wherein said bistable multivibrator is connected to the monostable multivibrator in the effective connection between said gate means and said detector means.

* * * * *